United States Patent [19]
Lahti

[11] Patent Number: 4,775,834
[45] Date of Patent: Oct. 4, 1988

[54] PULSE WIDTH-PULSE HEIGHT MULTIPLICATOR IN A STATIC KWH METER

[75] Inventor: Teuvo Lahti, Jyväskylä, Finland

[73] Assignee: Valmet Oy, Finland

[21] Appl. No.: 55,511

[22] Filed: May 28, 1987

Related U.S. Application Data

[63] Continuation of Ser. No. 719,270, filed as PCT FI84/00057, Aug. 17, 1984, published as WO85/00893, Feb. 28, 1985, abondoned.

[30] Foreign Application Priority Data

Aug. 18, 1983 [FI] Finland ................................. 832962

[51] Int. Cl.⁴ .............................................. G01R 21/06
[52] U.S. Cl. ................................. 324/142; 364/482; 364/842
[58] Field of Search ............... 324/142, 141; 328/160; 364/483, 842

[56] References Cited

U.S. PATENT DOCUMENTS 4,275,349 6/1981 Wintermute ................... 324/142

Primary Examiner—Ernest F. Karlsen
Attorney, Agent, or Firm—Steinberg & Raskin

[57] ABSTRACT

In a static KWh meter, a pulse width-pulse height multiplicator which forms a pulse width-pulse height-modulated signal proportional to the product of measuring signals proportional to voltage and current intensity, said signal being supplied to a voltage/frequency converter (5), from which is obtained a frequency signal (f) proportional to the power and which controls a counting device (7) indicating the energy consumed. The pulse width-pulse height multiplicator has been carried out without any operator amplifiers in that it contains summing members (R1, R2) for adding together a signal ($U_u$) proportional to the voltage and a triangle wave ($U_o$), and an analog switch (10) controlled by the summed signal ($U_o + U_u$) and which takes samples from a signal ($U_i$) proportional to the current intensity.

6 Claims, 4 Drawing Sheets

PULSE WIDTH-PULSE HEIGHT MULTIPLICATOR IN A STATIC KWH METER

This is a continuation of application Ser. No. 719,270, filed as PCT FI84/00057, Aug. 17, 1984, published as WO85/00893, on Feb. 28, 1985, now abandoned.

BACKGROUND OF THE INVENTION

1. Field of the Invention

The present invention concerns a static kWh meter, comprising members connected to the leads of the distribution network for producing measuring signals proportional to the current and the voltage, a pulse width-pulse height multiplicator for forming a signal representing the product of the measuring signals, a frequency/voltage converter with an analog integrator integrating the multiplicator output, for generating a frequency signal proportional to the power, and a counting device controlled by the frequency signal for determining the energy consumed, and a power pack unit connected to the mains leads.

2. Description of Related Art

Static kWh meters based on a pulse width-pulse height multiplicator, i.e., on a time-chopping multiplicator, are commonly known in the art, and as examples of existing design solutions may be mentioned the U.S. Pat. Nos. 4,315,212 and 3,794,917.

The main components of a three-phase meter of this type known in prior art are presented in the block diagram of FIG. 1. In the meter, a sample pulse sequence is formed in which the width of the pulses is proportional to the momentary value of the voltage and the height of the pulses is proportional to the momentary value of the current, so that the area subtended by the pulses is proportional to the product of voltage and current, i.e., to the power. The sample pulse frequency is selected to be approximately ten times higher than the mains frequency in order to account for superharmonics as well. The signal modulating the pulse width modulator 1, is a signal proportional to the mains voltage, produced by the aid of voltage transformers 2. In meters known in the art, the pulse width modulation has usually been carried out by means of an operational amplifier acting as a comparator, to one input terminal thereof being conducted a triangular wave and to the other input terminal a modulating signal proportional to the voltage. The threshold level of the comparator is controlled by the modulating voltage, and at the output of the comparator is obtained a square wave having the same frequency as the triangular wave but dependent on the value of the control voltage, as regards its pulse proportions. By the pulse width-modulated square wave obtained are controlled analog switches 4 in the secondary circuits of the current measuring transformers 3, from their outputs being obtained pulses with a height proportional to the current in the measuring circuit, and which are still modulated by the mains voltage as regards their width. The pulses are filtered so as to obtain a d.c. voltage proportional to the power, and this voltage is supplied to a voltage/frequency converter 5. The voltage/frequency converter 5 consists of an integrator amplifier integrating the output of the multiplicator and a threshold level detector, which initiates a new cycle when the output of the integrator exceeds the threshold level of the detector. Thus, the output of the converter delivers a pulse frequency which is proportional to the d.c. voltage supplied thereto, that is to the power, and by which the step motor actuating the counter means 7 of the meter is controlled over a divider unit 6. The counter means integrates the power, in other words, it displays the energy consumed. For the power supply of the circuits of the meter, a power pack 8 is moreover provided, producing the operating voltage from the mains voltage.

Static kWh meter designs of prior art are comparatively complex, and the units of the meters contain operational amplifiers, of which the offset voltages exert an influence on the accuracy of the meter.

SUMMARY OF THE INVENTION

The purpose with the invention is to solve the design of a static kWh meter in a manner more simple than in prior art, so that the pulse width-pulse height multiplicator part can be carried out without using any operational amplifiers.

The design solution of the invention is characterized in that the pulse width-pulse height multiplicator contains a summing member, to one input of which has been connected the first measuring signal and to the other input a triangle wave, and a switch controlled by the summing member and which takes samples from the other measuring signal.

BRIEF DESCRIPTION OF THE DRAWINGS

The invention is described in the following in detail by the aid of an embodiment example presented in the drawing, whereto the invention is not, however, intended to be exclusively confined. In the drawing.

DETAILED DESCRIPTION OF THE PREFERRED EMBODIMENTS

Figure 2:
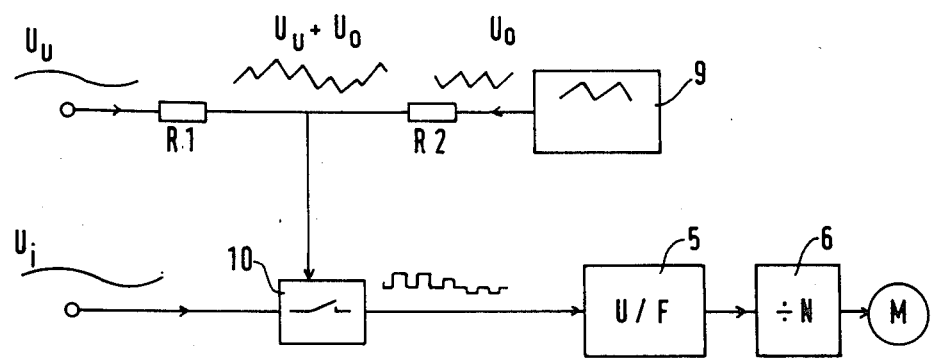
FIG. 2 presents the circuit diagram of the pulse width-pulse height multiplicator.
Figure 3:
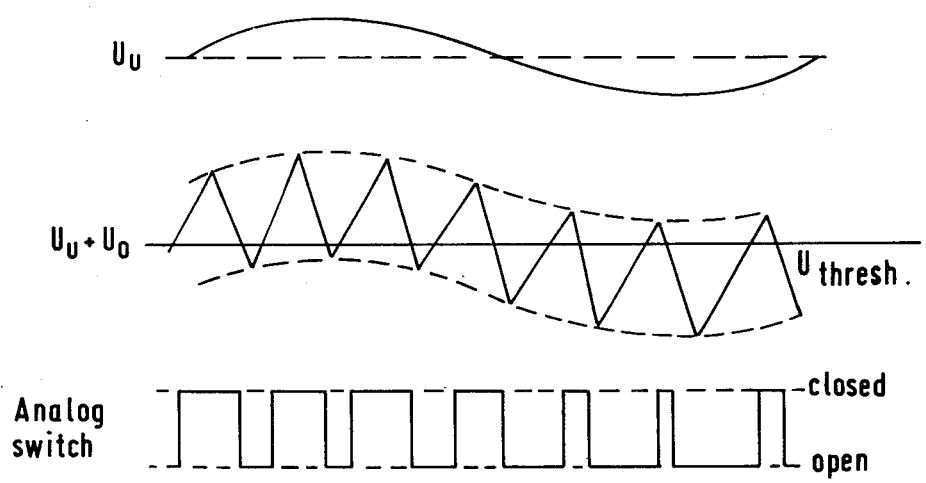
FIG. 3 shows the wave forms occurring in the circuit of FIG. 2.

In FIG. 2 is depicted the pulse width-pulse height multiplicator of a static kWh meter. The multiplicator comprises a summing circuit and a sampling switch controlled by the summed voltage. The summing circuit comprises two resistors R1,R2 joined by one end of each. To the other end of the first resistor R1 has been connected the signal $U_u$, which is proportional to the voltage, obtained from the measuring transformer 2, and to the other end of the second resistor R2 is carried the triangular wave $U_o$ from the triangular wave oscillator 9. The sum voltage $U_u+U_o$ is obtained at the common point of the summing resistors R1,R2. The sampling switch 10 is an analog switch receiving a signal $U_i$, proportional to the current intensity, from the secondary circuit of the current measuring transformer 3, the control input of said switch being connected to the summing point. The analog switch 10, which may for instance be a J-FET or a MOS-FET, changes its state at a given threshold value $U_{thresh}$ of the control voltage. As shown in FIG. 3, the threshold level $U_{thresh}$ of the analog switch 10 then determines the width of the sampling pulse in that the switch is closed when the sum wave $U_u + U_o$ is higher than the threshold level $U_{thresh}$, and open when the sum wave is lower than the threshold level. Hereby the output of the sampling switch controlled in such manner will be a square wave sequence in which the width of the pulses is proportional to the voltage and the height is proportional to the current. By the d.c. voltage obtained on filtering the pulse sequence, the voltage/frequency converter 5 is controlled.

Figure 1:
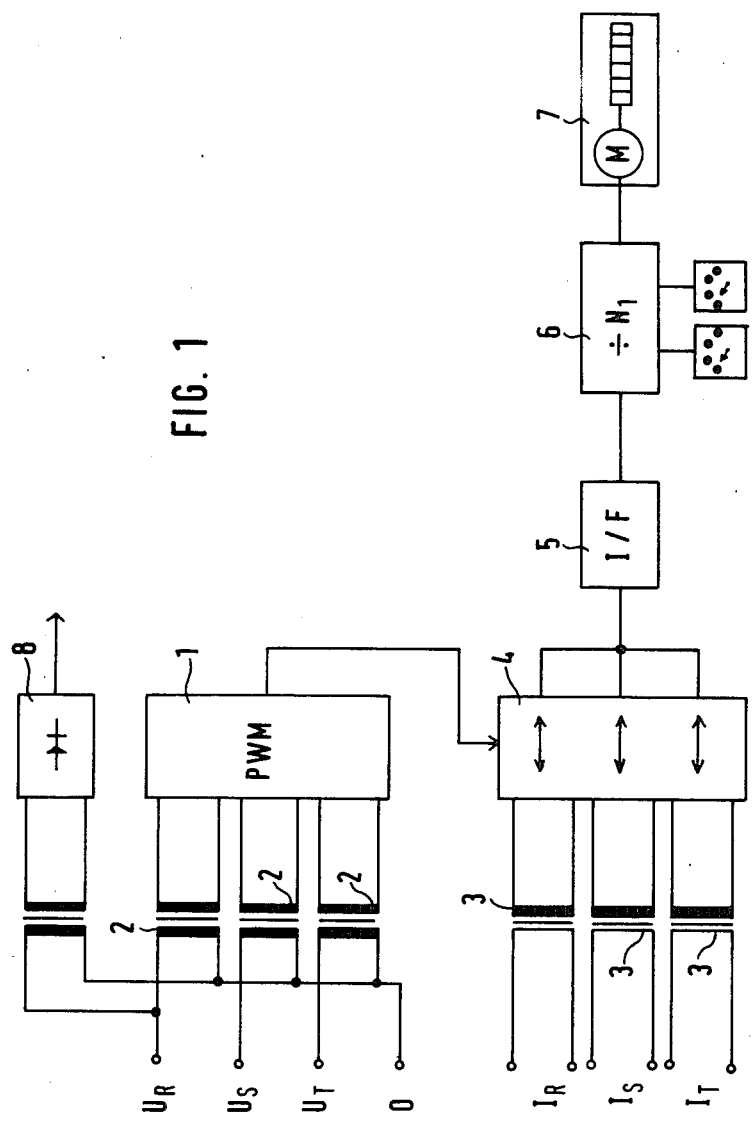
FIG. 1 presents the block diagram of a static kWh meter known in the prior art.
Figure 4:
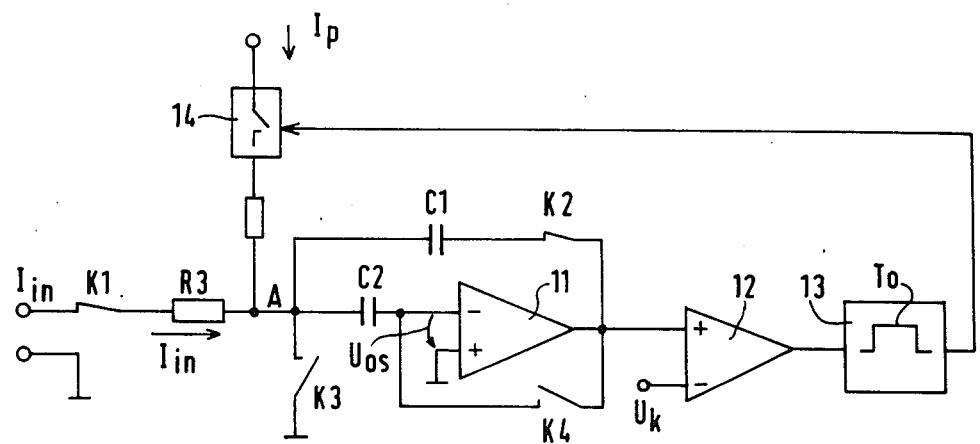
FIGS. 4 and 4A illustrate the voltage/frequency converter in different operating modes.

FIG. 4 presents the voltage/frequency converter 5 of the meter depicted in FIG. 1 and which has been provided with an offset voltage compensating circuit. The voltage/frequency converter includes, in conventional manner, an operational amplifier 11 connected with the aid of a capacitor C1 and a resistor R3 to serve as integrator, a threshold level detector 12 controlled by the output of the integrator, and a timing circuit 13 whereby a constant current source connected to the output of the integrator is controlled. When the circuit is active, the integrator integrates the input current $I_{in}$ until the output of the integrator exceeds the threshold level $U_k$ of the comparator 12, when the timing circuit 13 starts to run and by the aid of a switch 14 switches a feedback current pulse $I_p$ for the duration $T_o$ to the input of the integrator. The operating frequency f of the converter is then found by the formula $$I_{in} \cdot t = I_p \cdot T_o$$

$$f = \frac{1}{t} = \frac{I_{in}}{I_p \cdot T_o}$$

It is thus understood that the frequency f is directly proportional to the input current $I_{in}$, and therefore also to the input voltage $U_{in}$ because $$I_{in} = \frac{U_{in} - U_{os}}{R_3}$$

For compensating the effect on the input current $I_{in}$ from the offset voltage $U_{os}$ of the amplifier 11, the voltage/frequency converter comprises, according to the invention, a compensating arrangement which keeps the terminal on the side of the amplifier 11 of the resistor R3, or the point A in FIG. 4, at zero level during integration.

The compensating arrangement comprises a sampling switch K1 connecting the integrator to the multiplicator, a switch K2 in series with the integrating capacitor C1, and a compensating capacitor C2 between the point A and the inverting input of the amplifier 11, a switch K4 connecting the inverting input and the output of the amplifier 11, and a switch K3 grounding the point A.

Figure 4A:
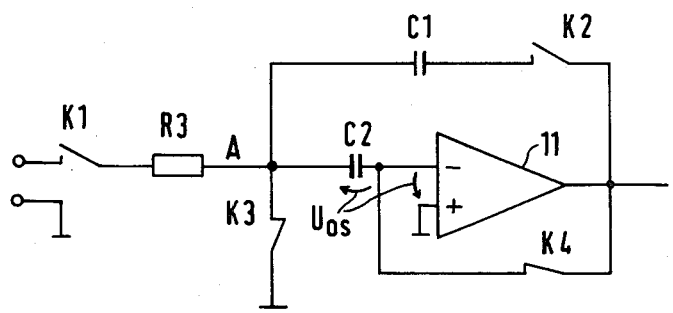

The switches K1 and K2 allow the input current $I_{in}$ to be integrated when they are closed in the position as in FIG. 4. During the integrating phase the switches K3 and K4 are open. For compensation, the integration is interrupted between the sampling periods of the sampling switch K1 by opening the switch K2 in series with the integrating capacitor C1. During the subsequent compensation phase, the output and inverting input of the amplifier 11 are connected by closing the switch K4, and the other terminal of the capacitor C2 is earthed by closing the switch K3, whereby the offset voltage $U_{os}$ of the amplifier 11 is charged into the compensating capacitor C2. During the compensation phase, the switches K1-K4 are thus controlled to be in the state as presented in FIG. 4A. During the subsequent integration phase, the switches K1-K4 are again controlled to be in the state of FIG. 4, whereby the compensating capacitor C2 is so connected to the input circuit that during the integration phase the voltage of the point A remains on zero level, which compensates for the effect of the offset voltage on the input current.

Figure 5:
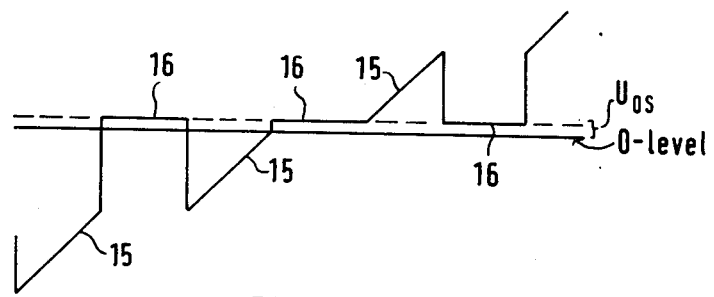
FIG. 5 shows the wave forms occurring in the converter of FIG. 4.

The resulting wave form of the output voltage of the integrator is shown in FIG. 5, where the alternating integration phases and compensation phases respectively are seen as ascending parts 15 of the output voltage and as horizontal parts 16 corresponding to the offset voltage $U_{os}$.

Figure 6:
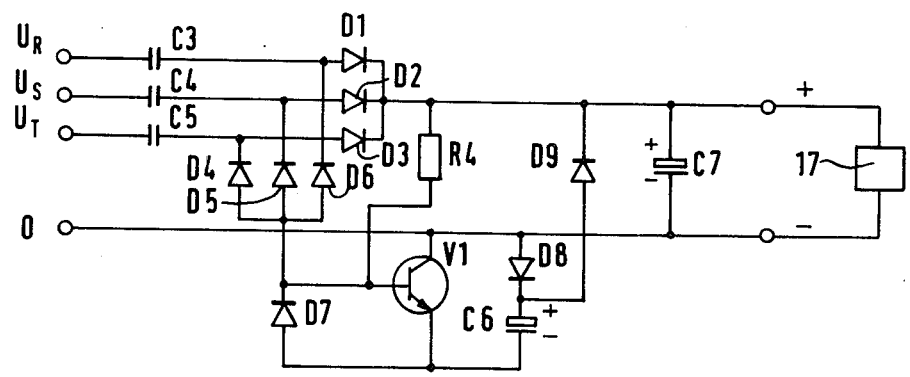
FIG. 6 presents the circuit diagram of the power source of the meter.

FIG. 6 presents the power source unit 8 providing the operating voltages for the circuits of a three-phase meter. The power source contains capacitors C3,C4,C5 for reducing the mains voltage $U_R, U_S, U_T$ and rectifying diodes D1-D6 and a filtering capacitor C7 for filtering the voltage supplied to the load 17. Since the circuits of the meter are required to operate also in the case that only one phase carries a voltage, the voltage reducing capacitors have to be dimensioned to be very large, in a conventional rectifying circuit. In order to avoid this, the power source of FIG. 6 has moreover been provided with a circuit by the aid of which the current passing through the diodes during the negative half-periods of the phase that has remained live can be utilized. This circuit comprises a capacitor C6 which has been connected between the zero lead and the anodes of the rectifying diodes D4-D6 connected together, in series with the diodes D8 and D7 so that it can take up a charge during the negative half-cycles of the live phase through the forward diodes D7,D8. For discharging the charge of the capacitor C6 to the load 17 during the positive half-cycles of the live phase, the positive terminal of the capacitor C6 has been connected to the positive terminal of the load 17 over the diode D9, and the negative terminal of the capacitor C6 has been connected to the negative terminal of the load over the collector-emitter path of the transistor V1, the base of which has been connected to the common point of the diodes D7 and D4-D6 and over the resistor R4 to the cathodes of the diodes D1-D3. The voltage present across the diode D7 when the charging current of the capacitor C6 is flowing keeps the base voltage of the transistor V1 about 0.7 V more negative than the emitter voltage, whereby the transistor is not conductive.

During the positive half-cycle the charging current of the capacitor C6 is interrupted. The base voltage of the transistor V1 will then increase to become more positive than the emitter voltage, by effect of the resistor R4. The transistor V1 becomes conductive and completes the discharge path of the capacitor C6. Hereby, the charge of the capacitor C6 is discharged through the diode D9 to the capacitor C7 and further to the load 17. During the positive half-cycles, current is moreover received through the diode D1. The discharge current of the capacitor C6 which is added to the said current will approximately double the current going to the load, and this enables the coupling capacitors C3,C4,C5 to be reduced to about one-half and, moreover, reduces the current drawn by the meter from the mains.

I claim:

1. In a watt-hour meter for monitoring power consumed by a load supplied with line voltage and line current from an electrical supply, an arrangement comprising:

(a) means for generating a periodic voltage signal indicative of the line voltage;
(b) means for generating a periodic current signal indicative of the line current;
(c) means for generating a triangular voltage signal consisting of a series of triangular waves;
(d) means for summing the triangular voltage signal and the periodic voltage signal to generate a sum signal; and
(e) means for generating a sequence of measuring pulses in which the widths of the pulses are indicative of the line voltage and the heights of the pulses are indicative of the line current being consumed by the load, including
  (i) a sampling switch having an input terminal to which the current signal is conducted, a control terminal to which the sum signal is conducted, and an output terminal from which the measuring pulses are conducted, and
  (ii) means for directly conducting the sum signal to the control terminal along a path free of operational amplifiers, whereby meter inaccuracies caused by the inherent offset voltage of operational amplifiers are avoided,
and further comprising means including an integrating capacitor and an operational amplifier having an offset voltage to be compensated, and operative for integrating the measuring pulses during successive sampling periods to generate an output signal, and means including a compenation capacitor, for compensating the output signal with the offset voltage of the operational amplifier, said compensating means including switching means operatively switching the integrating and compensation capacitors to the operational amplifier alternately between integration states in which the integrating capacitor is periodically increasingly charged, and the output signal periodically increased, during successive sampling periods, and compensation states in which the integrating capacitor is disconnected from the operational amplifier and not discharged during compensation periods which alternate with the sampling periods, and in which the compensation capacitor is charged during each compensation period to the offset voltage, said compensation capacitor maintaining the charge developed during each compensation state during each integration state to generate a compensated signal indicative of the power being consumed by the load.

2. The arrangement as recited in claim 1, wherein the operational amplifier has a first input terminal operatively connected to one plate of the compensation capacitor, said compensation capacitor having another plate to which the measuring pulses are conducted; and wherein the operational amplifier has a second grounded input terminal, and an output terminal from which the compensated signal is conducted, and wherein the integrating capacitor is connected during each integration state between the output terminal and said other plate of the compensation capacitor.

3. The arrangement as recited in claim 2, wherein the switching means includes first switching means operative for connecting the integrating capacitor between the output terminal and said other plate of the compensation capacitor during each integration state, and operative for disconnecting the integrating capacitor from the output terminal during each compensation state.

4. The arrangement as recited in claim 3, wherein the switching means includes second switching means operative for connecting said other plate of the compensation capacitor to ground during each compensation state, and also for connecting said one plate of the compensation capacitor to the output terminal during each compensation state.

5. The arrangement as recited in claim 4, wherein the operating voltage means includes a plurality of capacitors for reducing three-phase line voltage from a three-phase electrical supply.

6. The arrangement as recited in claim 5, wherein the operating voltage means includes a capacitor, and means for charging the same when no line voltage exists on two of the phases of the supply during negative half-cycles of live voltage which exists on the third phase; and further comprising means for charging the capacitor through the load during positive half-cycles of the live voltage.

* * * * *